(12) United States Patent
Keeling et al.

(10) Patent No.: US 9,972,434 B2
(45) Date of Patent: May 15, 2018

(54) MAGNETICALLY PERMEABLE STRUCTURES

(71) Applicant: QUALCOMM Incorporated, San Diego, CA (US)

(72) Inventors: Nicholas Athol Keeling, Munich (DE); Edward Van Boheemen, Munich (DE); Michael Le Gallais Kissin, Auckland (NZ); Jonathan Beaver, Auckland (NZ)

(73) Assignee: QUALCOMM Incorporated, San Diego, CA (US)

( * ) Notice: Subject to any disclaimer, the term of this patent is extended or adjusted under 35 U.S.C. 154(b) by 462 days.

(21) Appl. No.: 14/876,511

(22) Filed: Oct. 6, 2015

(65) Prior Publication Data

US 2016/0027577 A1    Jan. 28, 2016

Related U.S. Application Data

(62) Division of application No. 13/671,325, filed on Nov. 7, 2012, now Pat. No. 9,160,205.

(Continued)

(51) Int. Cl.
*H01F 27/42* (2006.01)
*H01F 37/00* (2006.01)
(Continued)

(52) U.S. Cl.
CPC ....... *H01F 41/0206* (2013.01); *H01F 27/022* (2013.01); *H01F 38/14* (2013.01);
(Continued)

(58) Field of Classification Search
CPC ......... H02J 5/005; H02J 17/00; B60L 11/182; H01F 27/022; H01F 27/263
(Continued)

(56) References Cited

U.S. PATENT DOCUMENTS 3,902,147 A    8/1975    Trench
4,234,865 A    11/1980   Shigehara
(Continued)

FOREIGN PATENT DOCUMENTS

CN    1411009 A    4/2003
CN    1950914 A    4/2007
(Continued)

OTHER PUBLICATIONS

International Search Report and Written Opinion—PCT/US2013/029401—ISA/EPO—dated Jun. 6, 2013.
(Continued)

*Primary Examiner* — Rexford Barnie
*Assistant Examiner* — Toan Vu
(74) *Attorney, Agent, or Firm* — Knobbe, Martens, Olson & Bear, LLP

(57) ABSTRACT

An apparatus, a system and a method for wireless power transfer are disclosed. A method of forming a physical core of a wireless power transfer device includes positioning two or more electromagnetically permeable members adjacent to one another and applying longitudinal pressure to an end of the electromagnetically permeable members, the electromagnetically permeable members at least partially encapsulated in retaining compound. A wireless power transfer device includes a casing in which is housed an induction coil, a plurality of electromagnetically permeable members arranged in a line and a retaining compound.

30 Claims, 10 Drawing Sheets

Related U.S. Application Data

(60) Provisional application No. 61/613,351, filed on Mar. 20, 2012.

(51) Int. Cl.
| | |
|---|---|
| *H01F 38/00* | (2006.01) |
| *H01F 41/02* | (2006.01) |
| *H02J 17/00* | (2006.01) |
| *H05K 13/00* | (2006.01) |
| *H02J 7/02* | (2016.01) |
| *H02J 50/70* | (2016.01) |
| *H02J 50/80* | (2016.01) |
| *H02J 50/90* | (2016.01) |
| *H02J 50/40* | (2016.01) |
| *H02J 50/60* | (2016.01) |
| *H02J 50/12* | (2016.01) |
| *H01F 27/02* | (2006.01) |
| *H01F 38/14* | (2006.01) |
| *H01F 41/00* | (2006.01) |
| *H01F 27/26* | (2006.01) |

(52) U.S. Cl.
CPC ............ *H01F 41/005* (2013.01); *H02J 7/025* (2013.01); *H02J 17/00* (2013.01); *H02J 50/12* (2016.02); *H02J 50/40* (2016.02); *H02J 50/60* (2016.02); *H02J 50/70* (2016.02); *H02J 50/80* (2016.02); *H02J 50/90* (2016.02); *H05K 13/00* (2013.01); *H01F 27/263* (2013.01); *Y10T 29/4902* (2015.01)

(58) Field of Classification Search
USPC ........................................................ 307/104
See application file for complete search history.

(56) References Cited

U.S. PATENT DOCUMENTS

| | | | |
|---|---|---|---|
| 4,538,863 | A | 9/1985 | Allen et al. |
| 4,605,818 | A | 8/1986 | Arroyo et al. |
| 4,623,865 | A | 11/1986 | Kiesel et al. |
| 4,800,328 | A | 1/1989 | Bolger et al. |
| 6,198,373 | B1 | 3/2001 | Ogawa et al. |
| 6,239,682 | B1 | 5/2001 | McCloskey |
| 6,333,573 | B1 | 12/2001 | Nakamura |
| 6,768,409 | B2 | 7/2004 | Inoue et al. |
| 6,784,778 | B2 | 8/2004 | Stitz et al. |
| 6,794,975 | B2 | 9/2004 | Iwao et al. |
| 7,154,204 | B2 | 12/2006 | Koenig |
| 7,280,022 | B2 | 10/2007 | Shinmen et al. |
| 7,595,571 | B2 | 9/2009 | Thirunarayan-Kumar et al. |
| 7,986,059 | B2 | 7/2011 | Randall |
| 8,035,255 | B2 | 10/2011 | Kurs et al. |
| 8,042,742 | B2 | 10/2011 | Kagaya et al. |
| 8,174,234 | B2 | 5/2012 | Julstrom et al. |
| 8,525,868 | B2 | 9/2013 | Forutanpour et al. |
| 8,928,445 | B2 | 1/2015 | Mori et al. |
| 2004/0124958 | A1 | 7/2004 | Watts et al. |
| 2006/0104006 | A1 | 5/2006 | Toshiharu |
| 2006/0133622 | A1 | 6/2006 | Chen |
| 2007/0222426 | A1 | 9/2007 | Waffenschmidt et al. |
| 2007/0287508 | A1 | 12/2007 | Telefus |
| 2008/0129246 | A1 | 6/2008 | Morita et al. |
| 2009/0096413 | A1 | 4/2009 | Partovi et al. |
| 2009/0160262 | A1 | 6/2009 | Schmidt et al. |
| 2009/0273242 | A1 | 11/2009 | Cook |
| 2009/0289752 | A1 | 11/2009 | Katsunori |
| 2010/0264872 | A1 | 10/2010 | Kwong |
| 2010/0277121 | A1 | 11/2010 | Hall et al. |
| 2010/0314946 | A1 | 12/2010 | Budde et al. |
| 2011/0062806 | A1 | 3/2011 | Ohashi et al. |
| 2011/0140539 | A1 | 6/2011 | Yamamoto et al. |
| 2011/0162881 | A1 | 7/2011 | Schipporeit |
| 2011/0187317 | A1 | 8/2011 | Mitake et al. |
| 2011/0234028 | A1 | 9/2011 | Iwasaki et al. |
| 2011/0316475 | A1 | 12/2011 | Jung et al. |
| 2012/0020485 | A1 | 1/2012 | Visser et al. |
| 2012/0026837 | A1 | 2/2012 | Li et al. |
| 2012/0074899 | A1 | 3/2012 | Tsai et al. |
| 2012/0091950 | A1 | 4/2012 | Campanella et al. |
| 2012/0119698 | A1 | 5/2012 | Karalis et al. |
| 2012/0161696 | A1 | 6/2012 | Cook et al. |
| 2012/0224456 | A1 | 9/2012 | Visser et al. |
| 2013/0249303 | A1 | 9/2013 | Keeling et al. |
| 2013/0249304 | A1 | 9/2013 | Keeling et al. |
| 2013/0249477 | A1 | 9/2013 | Keeling et al. |
| 2013/0300202 | A1 | 11/2013 | Keeling et al. |
| 2014/0055089 | A1 | 2/2014 | Ichikawa et al. |

FOREIGN PATENT DOCUMENTS

| | | |
|---|---|---|
| CN | 101454957 A | 6/2009 |
| CN | 101490923 A | 7/2009 |
| CN | 102089952 A | 6/2011 |
| DE | 19839458 | 3/2000 |
| DE | 102006025458 A1 | 12/2007 |
| DE | 102010050935 A1 | 9/2011 |
| EP | 1298683 A2 | 4/2003 |
| JP | S5339461 A | 4/1978 |
| JP | S59117106 A | 7/1984 |
| JP | H01175224 A | 7/1989 |
| JP | H0696965 A | 4/1994 |
| JP | H07192934 A | 7/1995 |
| JP | H07254517 A | 10/1995 |
| JP | H08255717 A | 10/1996 |
| JP | H09157440 A | 6/1997 |
| JP | H10632 A | 1/1998 |
| JP | H11273934 A | 10/1999 |
| JP | 2000150273 A | 5/2000 |
| JP | 2001008380 A | 1/2001 |
| JP | 2001210512 A | 8/2001 |
| JP | 2002343654 A | 11/2002 |
| JP | 2003158019 A | 5/2003 |
| JP | 2008087733 A | 4/2008 |
| JP | 2008120239 A | 5/2008 |
| JP | 2010003838 A | 1/2010 |
| JP | 2010172084 A | 8/2010 |
| JP | 2010226138 A | 10/2010 |
| JP | 2010263075 A | 11/2010 |
| JP | 2011204836 A | 10/2011 |
| WO | WO-2005024865 A2 | 3/2005 |
| WO | WO-2009123432 A2 | 10/2009 |
| WO | WO-2009151818 | 12/2009 |
| WO | WO-2010090538 A1 | 8/2010 |
| WO | WO-2010090539 A1 | 8/2010 |
| WO | WO-2012157114 A1 | 11/2012 |

OTHER PUBLICATIONS

Wikipedia : "Heat-shrink Tubing", as published Mar. 10, 2012, retrieved via archive.org/web at <http://web.archive.org/web/20120310052307/http://en.wikipedia.org/wiki/Heat-shrink_tubing>, 3 pages.

MAGNETICALLY PERMEABLE STRUCTURES

CROSS-REFERENCE TO RELATED APPLICATIONS

This is a divisional application of U.S. patent application Ser. No. 13/671,325, filed on Nov. 7, 2012, which claims priority to and the benefit of U.S. Provisional Application No. 61/613,351, filed on Mar. 20, 2012, the entire content of the foregoing applications being hereby incorporated by reference herein in their entireties.

TECHNICAL FIELD

The technical field relates generally to wireless power transfer, and more specifically to devices, systems, and methods related to wireless power transfer to remote systems such as vehicles including batteries. In particular the present disclosure relates to improvements in the efficiency of inductive power transfer circuits.

BACKGROUND

Remote systems, such as vehicles, have been introduced that include locomotion power derived from electricity received from an energy storage device such as a battery. For example, hybrid electric vehicles include on-board chargers that use power from vehicle braking and traditional motors to charge the vehicles. Vehicles that are solely electric generally receive the electricity for charging the batteries from other sources. Battery electric vehicles (electric vehicles) are often proposed to be charged through some type of wired alternating current (AC) such as household or commercial AC supply sources. The wired charging connections require cables or other similar connectors that are physically connected to a power supply. Cables and similar connectors may sometimes be inconvenient or cumbersome and have other drawbacks. Wireless charging systems that are capable of transferring power in free space (for example, via a wireless field) to be used to charge electric vehicles may overcome some of the deficiencies of wired charging solutions. As such, wireless charging systems and methods that efficiently and safely transfer power for charging electric vehicles are desirable.

Wireless power transfer systems may utilize inductive power transfer (IPT) to transfer power between a wireless charging system base and a mobile device pickup. IPT systems have a base unit which includes a tuned induction coil and drive circuitry and a mobile device which includes a similarly tuned induction coil and receive circuitry. Power may be transferred between the charging system base and the mobile device pickup due to coupling between the tuned induction coils. In single direction power transfer, energy is transferred from the base unit induction coil by way of a generated electromagnetic field within which the mobile device induction coil needs to be positioned. For efficient energy transfer the mobile device induction coil will typically be positioned close above and substantially co-axial to the base unit induction coil so as to achieve a strong degree of coupling between the electromagnetic field and the mobile device induction coil.

Many IPT systems also include a physical core made of a material having a high electromagnetic permeability. A commonly used material is ferrite. The physical core is highly permeable to electromagnetic fields and therefore greatly increases the magnitude of the generated electromagnetic field.

Some IPT systems include induction coils positioned above a ferrite core in the manner of a backing. A further advantage of using a ferrite core as a backing is that the electromagnetic field that surrounds the induction coil is constrained to the ferrite backing material on that side of the induction coil. The reason for this is that it is much easier for the electromagnetic field to travel through the ferrite material than air or other less permeable components.

Due to the ferrite's effect on the electromagnetic field produced by the induction coil, the presence of the ferrite also has a large influence on the inductance of the induction coil and therefore the coupling frequency. If the ferrite material exhibits a large variation in permeability then the induction coil will exhibit a similarly large variation in inductance and tuning making it difficult to achieve consistent tuning.

WO 2010/090539 discloses an IPT system for powering electric vehicles in which a base (usually the primary) coil consists of two separate co-planar coils positioned above a core formed from parallel bars of a material of high electromagnetic permeability, such as ferrite. In this arrangement, there is no straight path through the core that passes through the coils. As such, the coils act as pole areas and lines of electromagnetic flux arc between them in the form of a "flux pipe" above the coils, a zone of high flux concentration. Advantageously, the arrangement results in little leakage of flux below the coils on the side of the core.

Single homogeneous slabs or bars of highly electromagnetically permeable materials of the size typically required for use in wireless power transfer systems are fragile, difficult to obtain, expensive and may not provide suitable consistent permeability.

It is an object of the disclosed embodiments to address the foregoing problems or at least to provide the public with a useful choice. Further aspects and advantages of the present disclosure will become apparent from the ensuing description which is given by way of example only.

SUMMARY OF CERTAIN ASPECTS

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a method of forming a physical core of a wireless power transfer device. The method can include, for example, positioning two or more electromagnetically permeable members adjacent to one another in a line of electromagnetically permeable members. The step of positioning can involve positioning two or more electromagnetically permeable members adjacent one another within a wireless power transfer device casing. In some embodiments, the method further includes, for example, applying longitudinal pressure to an end of a line of electromagnetically permeable members. The application of longitudinal pressure may be applied by positioning a resilient spring member between an end of each line of electromagnetically permeable members and a first portion of the casing. In some embodiments, the method further includes, for example, positioning a further resilient spring member between the opposite end of each line of electromagnetically permeable members to the resilient spring member and a second portion of the casing. In some embodiments, the method further includes, for example, a partially encapsulating the electromagnetically permeable members in retaining compound. In some embodiments, the method further includes, for example, allowing the retaining compound to at least partially set, and releasing the longitudinal pressure applied to the end of each line of electromagnetically permeable members.

Another aspect of the disclosure provides a method of forming a wireless power transfer device. The method can include, for example, positioning two or more electromagnetically permeable members and an induction coil within a casing. In some embodiments, the method further includes, for example, arranging the electromagnetically permeable members to form a line of electromagnetically permeable members. The positioning of the electromagnetically permeable members can include, for example, positioning the two or more electromagnetically permeable members adjacent one another within a wireless power transfer device casing. In some embodiments, the method further includes, for example, positioning the electromagnetically permeable members in electromagnetic association with the induction coil. In some embodiments, the method further includes, for example, applying longitudinal pressure to an end of each line of electromagnetically permeable members. The application of longitudinal pressure can include, for example, positioning a resilient spring member between an end of each line of electromagnetically permeable members and a first portion of the casing. In some embodiments, the method further includes, for example, at least partially encapsulating the electromagnetically permeable members in a retaining compound. In some embodiments, the method further includes, for example, allowing the retaining compound to at least partially set, and releasing the longitudinal pressure applied to the end of each line of electromagnetically permeable members. In some embodiments, the method further includes, for example, positioning a further resilient spring member between the opposite end of each line of electromagnetically permeable members to the resilient spring member and a second portion of the casing.

In another aspect, a wireless power transfer device is provided. In some embodiments, the device includes a casing. In some embodiments, the casing houses an induction coil, a plurality of electromagnetically permeable members arranged a line or lines, and a retaining compound at least partially encapsulating the electromagnetically permeable members. In some embodiments, each line may include, for example, two or more electromagnetically permeable members abutting one another. The electromagnetically permeable members can be arranged in a plurality of substantially parallel lines. The spacing between adjacent parallel lines can be configured to allow a substantial portion of the electromagnetic field produced by the induction coil to pass through the parallel lines of electromagnetically permeable members. The electromagnetically permeable members can include, for example, ferrite bars. The electromagnetically permeable members and induction coil can be housed within a casing.

BRIEF DESCRIPTION OF THE DRAWINGS

These and/or other aspects will become apparent and more readily appreciated from the following drawings, which taken in conjunction with the Detailed Description of Certain Inventive Embodiments section and other sections of the present application, serve to explain the principles of the present disclosure.

Figure 1:
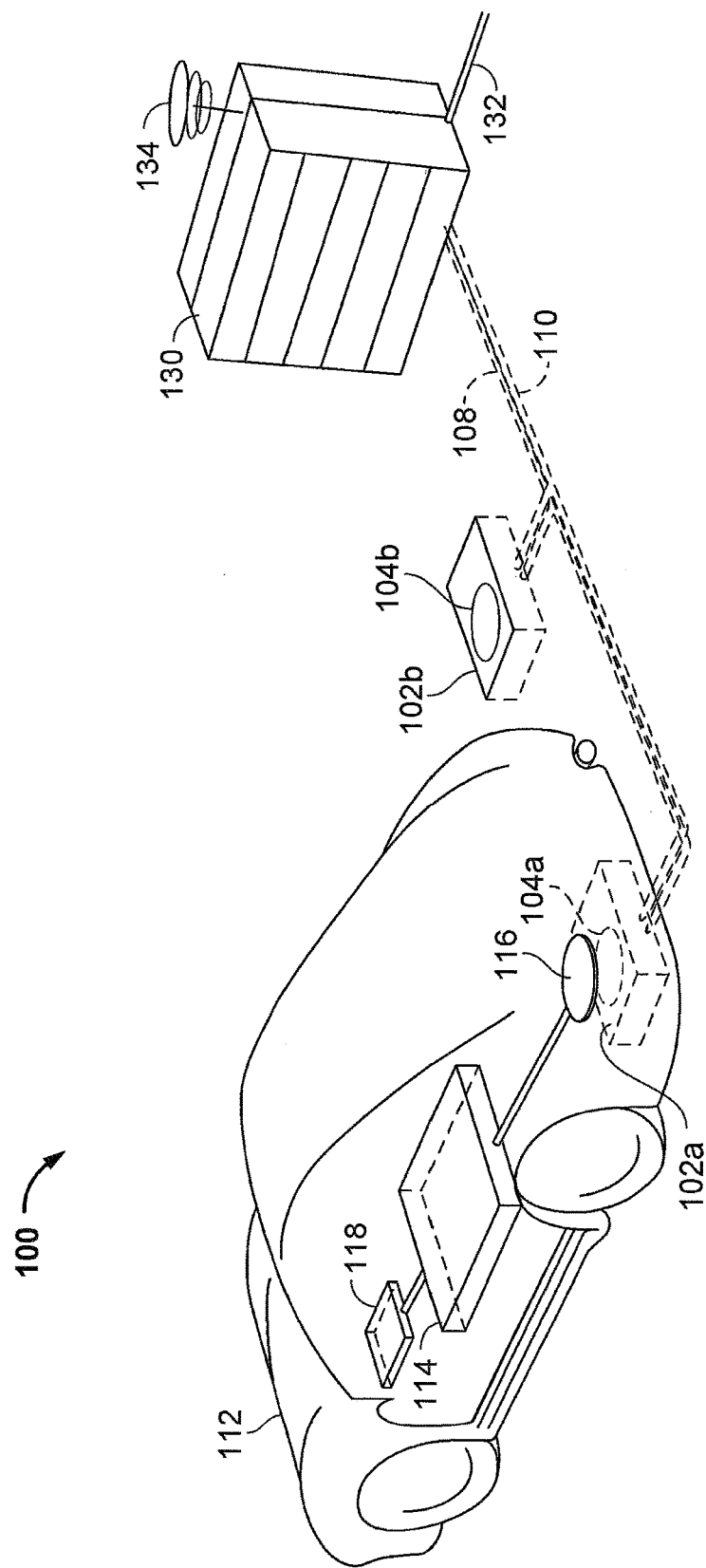
FIG. 1 is a perspective view of an exemplary wireless power transfer system for charging an electric vehicle, in accordance with an exemplary embodiment of the disclosure.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION OF CERTAIN INVENTIVE EMBODIMENTS

In the following detailed description, only certain exemplary embodiments have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

The detailed description set forth below in connection with the appended drawings is intended as a description of exemplary embodiments and is not intended to represent the only embodiments in which the invention may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments. It will be apparent that the exemplary embodiments may be practiced without these specific details. In some instances, some devices are shown in block diagram form.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. As used herein, the term "and/or" includes any and all combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Wirelessly transferring power may refer to transferring any form of energy associated with electric fields, magnetic fields, electromagnetic fields, or otherwise from a transmitter to a receiver without the use of physical electrical conductors (for example, power may be transferred through free space). The power output into a wireless field (for example, a magnetic field or an electromagnetic field) may be received, captured by, or coupled by a "receiving coil" to achieve power transfer. Accordingly, the terms "wireless" and "wirelessly" are used to indicate that power transfer between charging station and remote system is achieved without use of a cord-type electric conductor therebetween.

An electric vehicle is used herein to describe a remote system, an example of which is a vehicle that includes, as part of its locomotion capabilities, electrical power derived from a chargeable energy storage device (for example, a rechargeable electrochemical cell or other type of battery). As non-limiting examples, some electric vehicles may be hybrid electric vehicles that include besides electric motors, a traditional combustion engine for direct locomotion or to charge the vehicle's battery. Other electric vehicles may draw all locomotion ability from electrical power. An electric vehicle is not limited to an automobile and may include motorcycles, carts, scooters, and the like. By way of example and not limitation, a remote system is described herein in the form of an electric vehicle (EV). Furthermore, other remote systems that may be at least partially powered using a chargeable energy storage device are also contemplated (for example, electronic devices such as personal computing devices, mobile phones, and the like).

FIG. 1 is a perspective view of an exemplary wireless power transfer system 100 for charging an electric vehicle 112, in accordance with an exemplary embodiment of the present disclosure. The wireless power transfer system 100 enables charging of an electric vehicle 112 while the electric vehicle 112 is parked near a base wireless charging system 102a. Charging spaces for two electric vehicles are illustrated in a parking area. Each charging space is configured such that an electric vehicle can drive into the charging space and park over a base wireless charging system, such as base wireless charging systems 102a and 102b. In some embodiments, a local distribution center 130 may be connected to a power backbone 132 and configured to provide an alternating current (AC) or a direct current (DC) supply through a power link 110 to the base wireless charging system 102b. The power link may be an electric cable, cord, wire, or other device for transporting power along a distance. In some embodiments, power backbone 132 supplies power via power link 110 to one base wireless charging system; in other embodiments, the power backbone 132 may supply power via power link 110 to two or more base wireless charging systems. Thus, in some embodiments, power link 110 extends beyond base wireless charging system 102b, delivering power to additional base wireless charging systems, such as base wireless charging system 102a. While the description hereinafter refers to base wireless charging system 102a and its various components, the description is also applicable to base wireless charging system 102b and to any additional base wireless charging systems included within a wireless power transfer system 100.

The base wireless charging system 102a of various embodiments includes a base system induction coil 104a for wirelessly transferring or receiving power. When an electric vehicle 112 is within range of the base system charging system 102a, power may be transferred between the base wireless induction coil 104a and an electric vehicle induction coil 116 within the electric vehicle 112. In some embodiments, power may be transmitted from the base wireless induction coil 104a to the electric vehicle induction coil 116. Power received by the electric vehicle induction coil 116 can then be transported to one or more components within the electric vehicle 112 to provide power to the electric vehicle 112. Such components within the electric vehicle 112 include, for example, a battery unit 118 and an electric vehicle wireless charging system 114.

In some exemplary embodiments, the electric vehicle induction coil 116 is said to be within range of, and may receive power from, the base system induction coil 104a when the electric vehicle induction coil 116 is located within a target region of the electromagnetic field generated by the base system induction coil 104a. The target region corresponds to at least part of a region where energy output by the base system induction coil 104a may be captured by an electric vehicle induction coil 116. In some cases, the target region may correspond to the "near field" of the base system induction coil 104a. The near-field is at least part of the electromagnetic field produced by the base system induction coil 104a. The near-field may correspond to a region in which there are strong reactive fields that result from the currents and charges in the base system induction coil 104a and that do not radiate power away from the base system induction coil 104a. In some cases the near-field may correspond to a region within about $1/2\pi$ of the wavelength of the base system induction coil 104a. Additionally, in various embodiments, described in more detail below, power may be transmitted from the electric vehicle induction coil 116 to the base system induction coil 104a. In such embodiments, the near-field may correspond to a region that is within approximately $1/2\pi$ of the wavelength of the electric vehicle induction coil 116.

Local distribution 130 may be configured to communicate with external sources (for example, a power grid) via a communication backhaul 134, and with the base wireless charging system 102a via a communication link 108.

In various embodiments, aligning the electric vehicle induction coil 116 such that it is disposed within the near-field region of the base system induction coil 104a may advantageously improve or maximize power transfer efficiency. In some embodiments the electric vehicle induction coil 116 may be aligned with the base system induction coil 104a and, therefore, disposed within a near-field region simply by the driver properly aligning the electric vehicle 112 relative to the base system induction coil 104a. In other embodiments, the driver may be given visual feedback, auditory feedback, or combinations thereof to determine when the electric vehicle 112 is properly placed for wireless power transfer. In yet other embodiments, the electric vehicle 112 may be positioned by an autopilot system, which may move the electric vehicle 112 back and forth (for example, in zig-zag movements) until an alignment error has reached a tolerable value. This may be performed automatically and autonomously by the electric vehicle 112 without or with only minimal driver intervention provided the electric vehicle 112 is equipped with a servo steering wheel, ultrasonic sensors, and intelligence to adjust the vehicle. In still other embodiments, the electric vehicle induction coil 116, the base system induction coil 104a, or a combination thereof may have functionality for displacing and moving the induction coils 116 and 104a relative to each other to more accurately orient them and develop more efficient coupling therebetween.

The base wireless charging system 102a may be located in a variety of locations. As non-limiting examples, some suitable locations include a parking area at a home of the electric vehicle 112 owner, parking areas reserved for electric vehicle wireless charging modeled after petroleum-based filling stations, and parking lots at other locations such as shopping centers and places of employment.

Charging electric vehicles wirelessly may provide numerous benefits. For example, charging may be performed automatically, virtually without driver intervention and manipulations thereby improving convenience to a user. There may also be no exposed electrical contacts and no mechanical wear out, thereby improving reliability of the wireless power transfer system 100. Manipulations with cables and connectors can be avoided, and there may be no cables, plugs, or sockets that may be exposed to moisture and water in an outdoor environment, thereby improving safety. There may also be no sockets, cables, and plugs visible or accessible, thereby reducing potential vandalism of power charging devices. Further, since an electric vehicle 112 may be used as distributed storage devices to stabilize a power grid, a docking-to-grid solution may be used to increase availability of vehicles for Vehicle-to-Grid (V2G) operation.

A wireless power transfer system 100 as described with reference to FIG. 1 may also provide aesthetical and non-impedimental advantages. For example, there may be no charge columns and cables that may be impedimental for vehicles and/or pedestrians.

As a further explanation of the vehicle-to-grid capability, the wireless power transmit and receive capabilities may be configured to be reciprocal such that the base wireless charging system 102a transfers power to the electric vehicle 112 and the electric vehicle 112 transfers power to the base wireless charging system 102a for example, in times of energy shortfall. This capability may be useful to stabilize the power distribution grid by allowing electric vehicles to contribute power to the overall distribution system in times of energy shortfall caused by over demand or shortfall in renewable energy production (for example, wind or solar).

Figure 2:
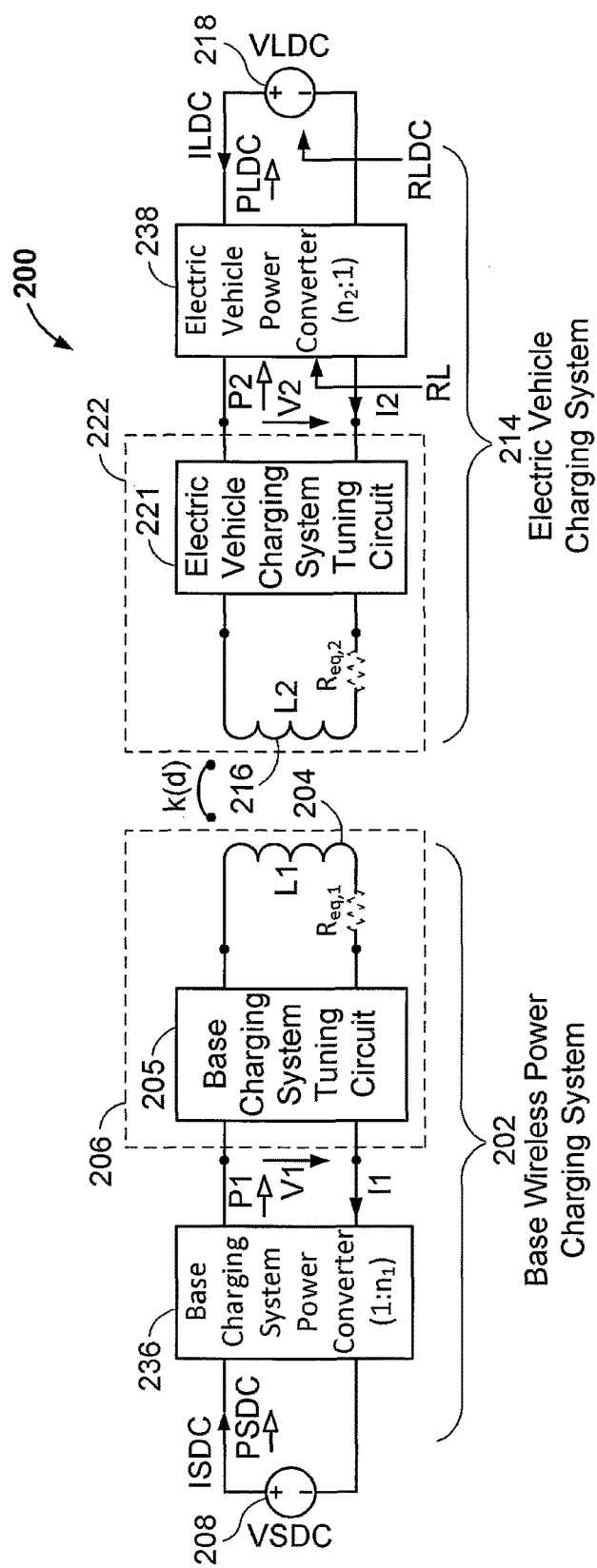
FIG. 2 is a schematic diagram of exemplary core components of the wireless power transfer system of FIG. 1.

FIG. 2 is a schematic diagram of exemplary components of the wireless power transfer system 100 of FIG. 1. As shown in FIG. 2, the wireless power transfer system 200 may include a base wireless power charging system 202, which includes a base system transmit circuit 206 including a base system induction coil 204 having an inductance L1. The wireless power transfer system 200 further includes an electric vehicle charging system, which includes an electric vehicle receive circuit 222 including an electric vehicle induction coil 216 having an inductance $L_2$. Embodiments described herein may use capacitively loaded wire loops (for example, multi-turn coils) to form a resonant structure capable of efficiently coupling energy from a primary structure (transmitter) to a secondary structure (receiver) via a magnetic or electromagnetic near field if both primary and secondary are tuned to a common resonant frequency. In some such embodiments, the electric vehicle induction coil 216 and the base system induction coil 204 may each comprise multi-turn coils. Using resonant structures for coupling energy may be referred to as "magnetic coupled resonance," "electromagnetic coupled resonance," and/or "resonant induction." The operation of the wireless power transfer system 200 will be described based on power transfer from a base wireless power charging system 202 to an electric vehicle 112, but is not limited thereto. For example, as discussed above, the electric vehicle 112 may transfer power to the base wireless charging system 102a.

With reference to FIG. 2, a power supply 208 (for example, AC or DC) supplies power PSDC to the base wireless power charging system 202 to transfer energy to an electric vehicle 112. The base wireless power charging system 202 includes a base charging system power converter 236. The base charging system power converter 236 may include circuitry such as an AC/DC converter configured to convert power from standard mains AC to DC power at a suitable voltage level, and a DC/low frequency (LF) converter configured to convert DC power to power at an operating frequency suitable for wireless high power transfer. The base charging system power converter 236 supplies power P1 to the base system transmit circuit 206 including a tuning network 205 which can consist of reactive tuning components in a series or parallel configuration or a combination of both with the base system induction coil 204 to emit an electromagnetic field at a desired frequency. A capacitor may be provided to form a resonant circuit with the base system induction coil 204 configured to resonate at a desired frequency. The base system induction coil 204 receives the power $P_1$ and wirelessly transmits power at a level sufficient to charge or power the electric vehicle 112. For example, the power level provided wirelessly by the base system induction coil 204 may be on the order of kilowatts (kW) (for example, anywhere from 1 kW to 110 kW or higher or lower).

The base system transmit circuit 206 including the base system induction coil 204 and electric vehicle receive circuit 222 including the electric vehicle induction coil 216 may be tuned to substantially the same frequencies and may be positioned within the near-field of an electromagnetic field transmitted by one of the base system induction coil 204 and the electric vehicle induction coil 216. In this case, the base system induction coil 204 and electric vehicle induction coil 216 may become coupled to one another through the electromagnetic field therebetween such that power may be transferred to the electric vehicle receive circuit 222 including a tuning network 221 and electric vehicle induction coil 216. The tuning network 221 may be provided to form a resonant circuit with the electric vehicle induction coil 216 configured to resonate at a desired frequency. The mutual coupling coefficient resulting at coil separation is represented by k(d). Equivalent resistances Req,1 and Req,2 represent the losses that may be inherent to the induction coils 204 and 216 and any anti-reactance capacitors that may, in some embodiments, be provided in the base charging system tuning circuit 205 and electric vehicle charging system tuning circuit 221 respectively. The electric vehicle receive circuit 222 including the electric vehicle induction coil 316 and tuning network 221 receives power P2 from the base wireless power charging system 202 via the electromagnetic field between induction coils 204 and 216. The electric vehicle receive circuit 222 then provides the power P2 to an electric vehicle power converter 238 of an electric vehicle charging system 214 to enable usage of the power by the electric vehicle 112.

The electric vehicle power converter 238 may include, among other things, a LF/DC converter configured to convert power at an operating frequency back to DC power at a voltage level matched to the voltage level of an electric vehicle battery unit 218. The electric vehicle power converter 238 may provide the converted power PLDC to charge the electric vehicle battery unit 218. The power supply 208, base charging system power converter 236, and base system induction coil 204 may be stationary and located at a variety of locations as discussed above. The battery unit 218, electric vehicle power converter 238, and electric vehicle induction coil 216 may be included in an electric vehicle charging system 214 included or formed as part of electric vehicle 112 or part of a battery pack (not shown). The electric vehicle charging system 214 may also be configured to provide power wirelessly through the electric vehicle induction coil 216 to the base wireless power charging system 202 to feed power back to the grid. Each of the electric vehicle induction coil 216 and the base system induction coil 204 may act as transmit or receive induction coils based on the mode of operation.

While not shown, the wireless power transfer system 200 may include a load disconnect unit (LDU) to safely disconnect the electric vehicle battery unit 218 or the power supply 208 from the wireless power transfer system 200. For example, in case of an emergency or system failure, the LDU may be triggered to disconnect the load from the wireless power transfer system 200. The LDU may be provided in addition to a battery management system for managing charging to a battery, or it may be part of the battery management system.

Further, the electric vehicle charging system 214 may include switching circuitry (not shown) for selectively connecting and disconnecting the electric vehicle induction coil 216 to the electric vehicle power converter 238. Disconnecting the electric vehicle induction coil 216 may suspend charging and also may adjust the "load" as "seen" by the base wireless charging system 202 (acting as a transmitter), which may be used to decouple the electric vehicle charging system 214 (acting as the receiver) from the base wireless charging system 202. The load changes may be detected if the transmitter includes the load sensing circuit. Accordingly, the transmitter, such as a base wireless charging system 202, may have a mechanism for determining when receivers, such as an electric vehicle charging system 214, are present in the near-field of the base system induction coil 204.

As described above, in operation, assuming energy transfer towards the vehicle or battery, input power is provided from the power supply 208 such that the base system induction coil 204 generates a field for providing the energy transfer. The electric vehicle induction coil 216 couples to the radiated field and generates output power for storage or consumption by the electric vehicle 112. As described above, in some embodiments, the base system induction coil 204 and electric vehicle induction coil 216 are configured according to a mutual resonant relationship such that the resonant frequency of the electric vehicle induction coil 216 and the resonant frequency of the base system induction coil 204 are very close or substantially the same. Transmission losses between the base wireless power charging system 202 and electric vehicle charging system 214 are minimal when the electric vehicle induction coil 216 is located in the near-field of the base system induction coil 204.

As stated, an efficient energy transfer occurs by coupling a large portion of the energy in the near field of a transmitting induction coil to a receiving induction coil rather than propagating most of the energy in an electromagnetic wave beyond the near-field. When in the near field, a coupling mode may be established between the transmit induction coil and the receive induction coil. The area around the induction coils where this near field coupling may occur is referred to herein as a near field coupling mode region.

While not shown, the base charging system power converter 236 and the electric vehicle power converter 238 may both include an oscillator, a driver circuit such as a power amplifier, a filter, and a matching circuit for efficient coupling with the wireless power induction coil. The oscillator may be configured to generate a desired frequency, which may be adjusted in response to an adjustment signal. The oscillator signal may be amplified by a power amplifier with an amplification amount responsive to control signals. The filter and matching circuit may be included to filter out harmonics or other unwanted frequencies and match the impedance of the power conversion module to the wireless power induction coil. The power converters 236 and 238 may also include a rectifier and switching circuitry to generate a suitable power output to charge a battery or power a load.

The electric vehicle induction coil 216 and base system induction coil 204 as described throughout the disclosed embodiments may be referred to or configured as "loop" antennas, and more specifically, multi-turn loop antennas. The induction coils 204 and 216 may also be referred to herein or be configured as "magnetic" antennas. The term "coils" is intended to refer to a component that may wirelessly output or receive energy for coupling to another "coil." The coil may also be referred to as an "antenna" of a type configured to wirelessly output or receive power. As used herein, coils 204 and 216 are examples of "power transfer components" of a type that are configured to wirelessly output, wirelessly receive, and/or wirelessly relay power. Loop (for example, multi-turn loop) antennas may be configured to include an air core or a physical core such as a ferrite core. An air core loop antenna may allow the placement of other components within the core area. Physical core antennas including ferromagnetic or ferrimagnetic materials may allow development of a stronger electromagnetic field and improved coupling. Unlike a transformer core, the physical core of an IPT coil does not necessarily pass through the center of a coil, the core may simply be positioned in close proximity to an associated coil.

As discussed above, efficient transfer of energy between a transmitter and receiver occurs during matched or nearly matched resonance between a transmitter and a receiver. However, even when resonance between a transmitter and receiver are not matched, energy may be transferred at a lower efficiency. Transfer of energy occurs by coupling energy from the near field of the transmitting induction coil to the receiving induction coil residing within a region (for example, within a predetermined frequency range of the resonant frequency, or within a predetermined distance of the near-field region) where this near field is established rather than propagating the energy from the transmitting induction coil into free space.

A resonant frequency may be based on the inductance and capacitance of a transmit circuit including an induction coil (for example, the base system induction coil 204) as described above. As shown in FIG. 2, inductance may generally be the inductance of the induction coil, whereas, capacitance may be added to the induction coil to create a resonant structure at a desired resonant frequency. As a non-limiting example, a capacitor (not shown) may be added in series with the induction coil (for example, induction coil 204) to create a resonant circuit (for example, the base system transmit circuit 206) configured to generate an electromagnetic field. Accordingly, for larger diameter induction coils, the value of capacitance for inducing resonance may decrease as the diameter or inductance of the coil increases. Inductance may also depend on a number of turns of an induction coil. Furthermore, as the diameter of the induction coil increases, the efficient energy transfer area of the near field may increase. Other resonant circuits are possible. As another non limiting example, a capacitor may be placed in parallel between the two terminals of the induction coil (for example, a parallel resonant circuit). Furthermore an induction coil may be designed to have a high quality (Q) factor to improve the resonance of the induction coil.

As described above, according to some embodiments, coupling power between two induction coils in the near field of one another is disclosed. As described above, the near field may correspond to a region around the induction coil in which electromagnetic fields exist but may not propagate or radiate away from the induction coil. Near-field coupling-mode regions may correspond to a volume in proximity to the physical volume of the induction coil, typically within a small fraction of the wavelength. According to some embodiments, electromagnetic induction coils, such as single and multi-turn loop antennas, are used for both transmitting and receiving since magnetic near field amplitudes in practical embodiments tend to be higher for magnetic type coils in comparison to the electric near fields of an electric type antenna (for example, a small dipole). This allows for potentially higher coupling between the pair. Furthermore, "electric" antennas (for example, dipoles and monopoles) or a combination of magnetic and electric antennas may be used.

Figure 3:
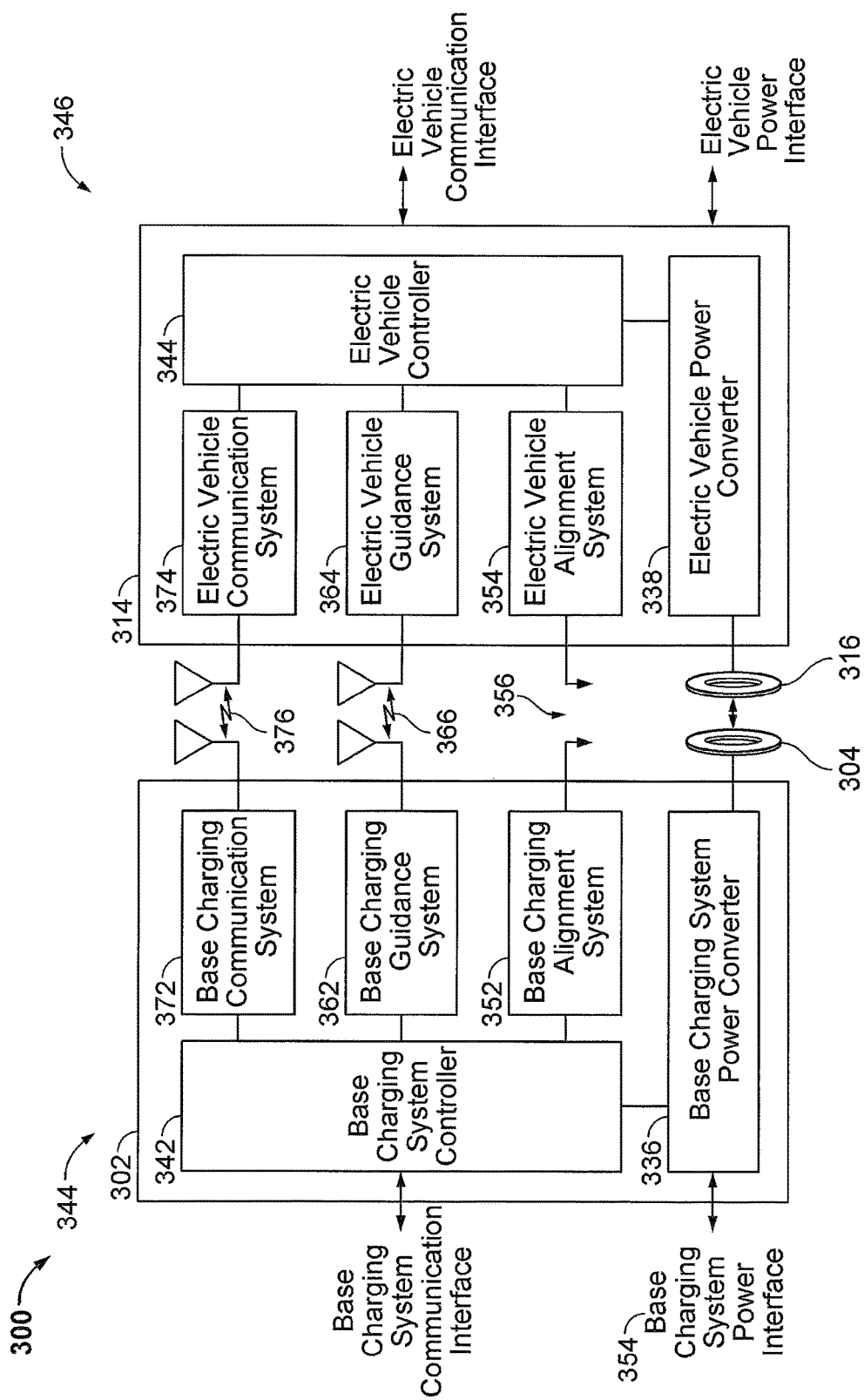
FIG. 3 is a block diagram showing exemplary core and ancillary components of the wireless power transfer system of FIG. 1.

FIG. 3 is a functional block diagram showing exemplary core and ancillary components of the wireless power transfer system 300 of FIG. 1. The wireless power transfer system 300 illustrates a communication link 376, a guidance link 366, and alignment systems 352, 354 for the base system induction coil 304 and electric vehicle induction coil 316. As described above with reference to FIG. 2, showing an example energy flow towards the electric vehicle 112, FIG. 3 depicts a base charging system power interface 354, which may also be configured to provide power to a charging system power converter 336 from a power source, such as an AC or DC power supply 126. The base charging system power converter 336 may receive AC or DC power from the base charging system power interface 354 to excite the base system induction coil 304 at or near its resonant frequency. The electric vehicle induction coil 316, when in the near field coupling-mode region, may receive energy from the near field coupling mode region to oscillate at or near the resonant frequency. The electric vehicle power converter 338 converts the oscillating signal from the electric vehicle induction coil 316 to a power signal suitable for charging a battery via the electric vehicle power interface.

The base wireless charging system 302 includes a base charging system controller 342 and the electric vehicle charging system 314 includes an electric vehicle controller 344. The base charging system controller 342 may include a base charging system communication interface 162 to other systems (not shown) such as, for example, a computer, and a power distribution center, or a smart power grid. The electric vehicle controller 344 may include an electric vehicle communication interface to other systems (not shown) such as, for example, an on-board computer on the vehicle, other battery charging controller, other electronic systems within the vehicles, and remote electronic systems.

The base charging system controller 342 and electric vehicle controller 344 may include subsystems or modules for specific application with separate communication channels. These communications channels may be separate physical channels or separate logical channels. As non-limiting examples, a base charging alignment system 352 may communicate with an electric vehicle alignment system 354 through a communication link 376 to provide a feedback mechanism for more closely aligning the base system induction coil 304 and electric vehicle induction coil 316, either autonomously or with operator assistance. Similarly, a base charging guidance system 362 may communicate with an electric vehicle guidance system 364 through a guidance link to provide a feedback mechanism to guide an operator in aligning the base system induction coil 304 and electric vehicle induction coil 316. In addition, there may be separate general-purpose communication links (for example, channels) supported by base charging communication system 372 and electric vehicle communication system 374 for communicating other information between the base wireless power charging system 302 and the electric vehicle charging system 314. This information may include information about electric vehicle characteristics, battery characteristics, charging status, and power capabilities of both the base wireless power charging system 302 and the electric vehicle charging system 314, as well as maintenance and diagnostic data for the electric vehicle 112. These communication channels may be separate physical communication channels such as, for example, Bluetooth, zigbee, cellular, etc.

Electric vehicle controller 344 may also include a battery management system (BMS) (not shown) configured to manage charge and discharge of the electric vehicle principal battery, a parking assistance system based on microwave or ultrasonic radar principles, a brake system configured to perform a semi-automatic parking operation, and a steering wheel servo system configured to assist with a largely automated parking 'park by wire' that may thus provide higher parking accuracy, thus reducing the need for mechanical horizontal induction coil alignment in any of the base wireless charging system 102*a* and the electric vehicle charging system 114. Further, electric vehicle controller 344 may be configured to communicate with electronics of the electric vehicle 112. For example, electric vehicle controller 344 may be configured to communicate with visual output devices (for example, a dashboard display), acoustic/audio output devices (for example, buzzer, speakers), mechanical input devices (for example, keyboard, touch screen, and pointing devices such as joystick, trackball, etc.), and audio input devices (for example, microphone with electronic voice recognition).

Furthermore, the wireless power transfer system 300 may include detection and sensor systems. For example, the wireless power transfer system 300 may include sensors for use with systems to properly guide the driver or the vehicle to the charging spot, sensors to mutually align the induction coils with the required separation/coupling, sensors configured to detect objects that may obstruct the electric vehicle induction coil 316 from moving to a particular height and/or position to achieve coupling, and safety sensors for use with systems to perform a reliable, damage free, and safe operation of the system. For example, a safety sensor may include a sensor for detection of presence of animals or children approaching the wireless power induction coils 104a, 116 beyond a safety radius, detection of metal objects near the base system induction coil 304 that may be heated up (induction heating), detection of hazardous events such as incandescent objects on the base system induction coil 304, and temperature monitoring of the base wireless power charging system 302 and electric vehicle charging system 314 components.

The wireless power transfer system 300 may also support plug-in charging via a wired connection. A wired charge port may integrate the outputs of the two different chargers prior to transferring power to or from the electric vehicle 112. Switching circuits may provide the functionality to support both wireless charging and charging via a wired charge port.

To communicate between a base wireless charging system 302 and an electric vehicle charging system 314, the wireless power transfer system 300 may employ both in-band signaling or an RF data modem (for example, Ethernet over radio in an unlicensed band) or both. The out-of-band communication may provide sufficient bandwidth for the allocation of value-add services to the vehicle user/owner. A low depth amplitude or phase modulation of the wireless power carrier may serve as an in-band signaling system with minimal interference.

In some embodiments, communication may be performed via the wireless power link without using specific communications antennas. For example, the wireless power induction coils 304 and 316 may also be configured to act as wireless communication transmitters and/or receivers. Thus, some embodiments of the base wireless power charging system 302 may include a controller (not shown) for enabling keying type protocol on the wireless power path. By way of illustration, keying the transmit power level (amplitude shift keying) at predefined intervals with a predefined protocol may provide a mechanism by which the receiver may detect a serial communication from the transmitter. The base charging system power converter 336 may include a load sensing circuit (not shown) for detecting the presence or absence of active electric vehicle receivers in the vicinity of the near field generated by the base system induction coil 304. By way of example, a load sensing circuit monitors the current flowing to the driver or power amplifier, which is affected by the presence or absence of active receivers in the vicinity of the near field generated by base system induction coil 104a. Detection of changes to the loading on the power amplifier may be monitored by the base charging system controller 342 for use in determining whether to enable the oscillator for transmitting energy, to communicate with an active receiver, or a combination thereof.

To enable wireless high power transfer, some embodiments may be configured to transfer power at a frequency in the range from 10-60 kHz. This low frequency coupling may allow highly efficient power conversion that may be achieved using solid state devices. In addition, there may be less coexistence issues with radio systems compared to other bands.

Figure 4:
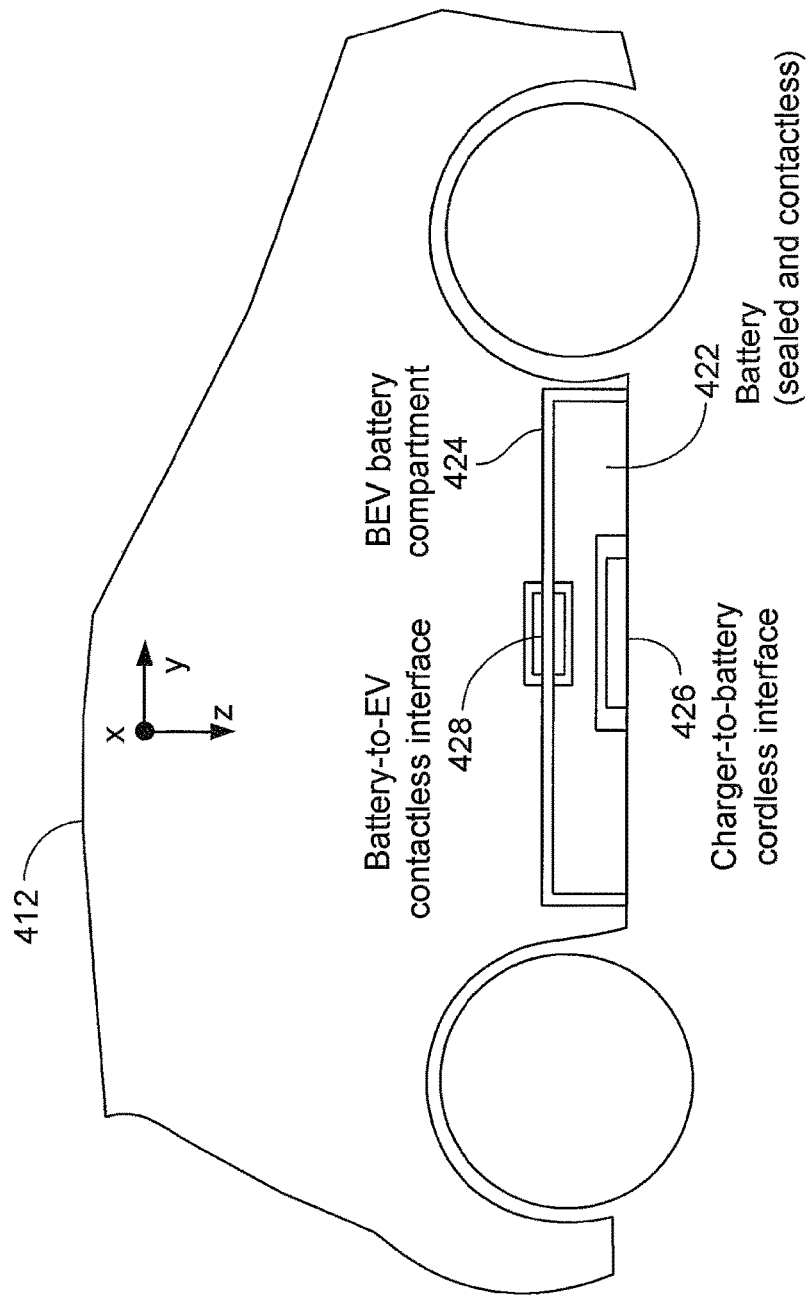
FIG. 4 is a functional block diagram showing a replaceable contactless battery disposed in an electric vehicle, in accordance with an exemplary embodiment of the disclosure.

The wireless power transfer system 100 described may be used with a variety of electric vehicles 102 including rechargeable or replaceable batteries. FIG. 4 is a functional diagram showing a replaceable contactless battery 422 disposed in an electric vehicle 412, in accordance with an exemplary embodiment. In this embodiment, the low battery position may be useful for an electric vehicle battery unit configured to integrate a wireless power interface (for example, a charger-to-battery cordless interface 426) and that may be configured to receive power from a charger (not shown) embedded in the ground. In FIG. 4, the electric vehicle battery unit may be a rechargeable battery unit, and may be accommodated in a battery compartment 424. The electric vehicle battery unit also provides a wireless power interface 426, which may integrate the entire electric vehicle wireless power subsystem including a resonant induction coil, power conversion circuitry, and other control and communications functions for efficient and safe wireless energy transfer between a ground-based wireless charging unit and the electric vehicle battery unit.

It may be useful for the electric vehicle induction coil to be integrated flush with a bottom side of electric vehicle battery unit or the vehicle body so that there are no protrusive parts and/or so that the specified ground-to-vehicle body clearance may be maintained. This configuration may require some room in the electric vehicle battery unit dedicated to the electric vehicle wireless power subsystem. The electric vehicle battery unit 422 may also include a battery-to-EV cordless interface 422, and a charger-to-battery cordless interface 426 configured to provide contactless power and communication between the electric vehicle 412 and a base wireless charging system 102a as shown in FIG. 1.

In some embodiments, and with reference to FIG. 1, the base system induction coil 104a and the electric vehicle induction coil 116 may be in a fixed position and the induction coils are brought within a near-field coupling region by overall placement of the electric vehicle induction coil 116 relative to the base wireless charging system 102a. However, in order to perform energy transfer rapidly, efficiently, and safely, the distance between the base system induction coil 104a and the electric vehicle induction coil 116 may be reduced to improve coupling. Thus, in some embodiments, the base system induction coil 104a and/or the electric vehicle induction coil 116 may be deployable and/or moveable to bring them into better alignment.

FIGS. 5A, 5B, 5C, and 5D are side cross-sectional views of exemplary configurations for the placement of an induction coil and ferrite material relative to a battery, in accordance with exemplary embodiments. Additional variations and enhancements to these configurations are described below.

Figure 5A:
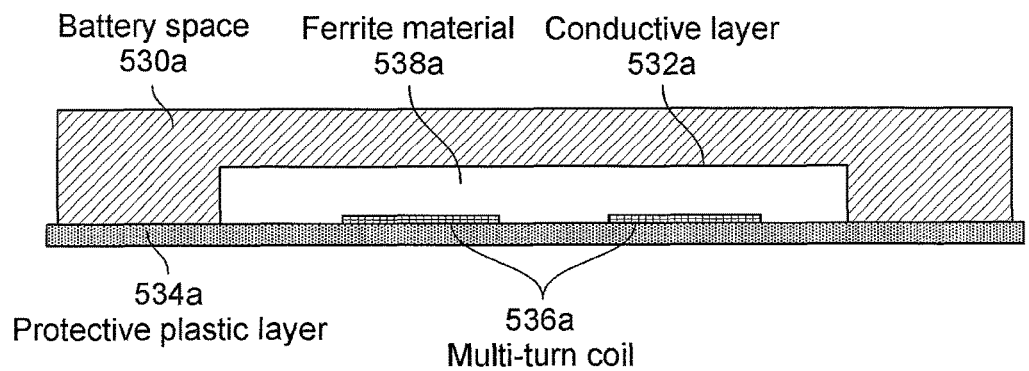
FIGS. 5A, 5B, 5C, and 5D are side cross-sectional views of exemplary configurations for the placement of an induction coil and ferrite material relative to a battery, in accordance with exemplary embodiments of the disclosure.

FIG. 5A shows a cross-section view of an example ferrite embedded induction coil 536a. The wireless power induction coil may include a ferrite material 538a and a coil 536a wound about the ferrite material 538a. The coil 536a itself may be made of stranded Litz wire. A conductive shield 532a may be provided to protect passengers of the vehicle from excessive EMF transmission. Conductive shielding may be particularly useful in vehicles made of plastic or composites.

Figure 5B:
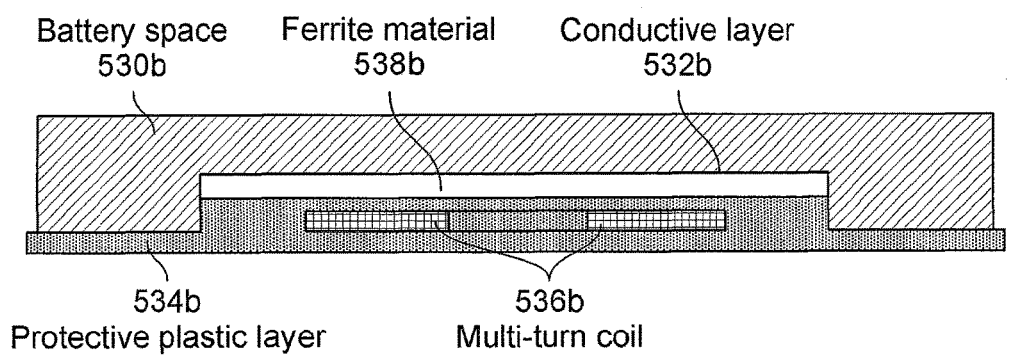

FIG. 5B shows an optimally dimensioned ferrite plate 538b (for example, ferrite backing) to enhance coupling and to reduce eddy currents (heat dissipation) in the conductive shield 532b. The coil 536b may be fully embedded in a non-conducting non-magnetic (for example, plastic) material. For example, as illustrated in FIG. 5A-5D, the coil 536b may be embedded in a protective housing 534b. There may be a separation between the coil 536b and the ferrite material 538b as the result of a trade-off between magnetic coupling and ferrite hysteresis losses.

Figure 5C:
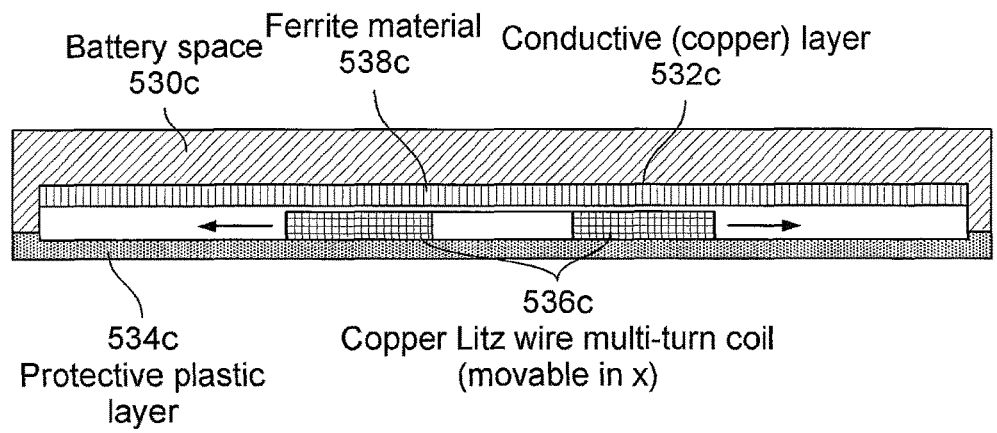

FIG. 5C illustrates another embodiment where the coil 536c (for example, a copper Litz wire multi-turn coil) may be movable in a lateral ("X") direction. Litz wire may be provided for use in high frequency alternating currents. Litz wire includes an insulating sheath including many thin wire strands, each of which are individually insulated and then twisted or woven together. The multiple strands negate the skin effect which can occur at high frequency by having many cores through which the current can travel. It should be appreciated however that the Litz wire is only one type of conductive filament that can be used in relation to certain embodiments described herein and is given by way of example. In one embodiment, Litz wire is used which has an external silk or nylon sheath insulation around the bundle of strands. Two layers of nylon may be used which assists the epoxy to wick into the Litz wire. The braid used may be sufficiently fine so as not to reduce the flexibility of the wire and not add too much thickness to the cable. The purpose of the sheath initially is to provide insulation to the strands enabling them to cooperate as a single conductive wire. Litz wire has strands that may be fragile and prone to breakage, particularly when used in an impact exposed situation. The individual strands can be coated with an insulating layer such as enamel or polyurethane.

Figure 5D:
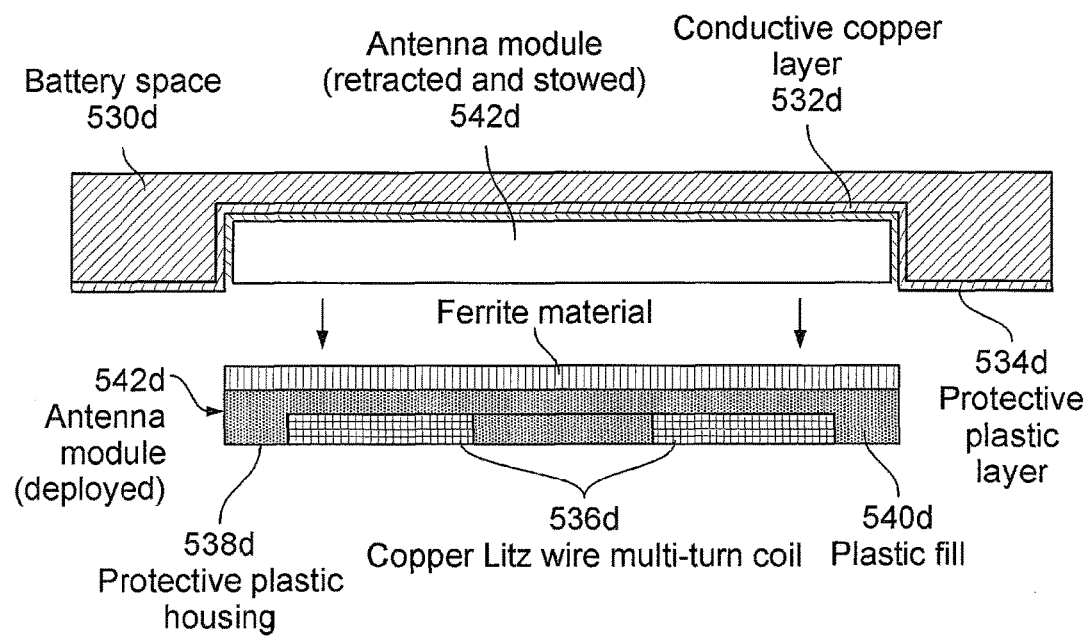

FIG. 5D illustrates another embodiment where the induction coil module is deployed in a downward direction. In some embodiments, the battery unit includes one of a deployable and non-deployable electric vehicle induction coil module 540d as part of the wireless power interface. To prevent electromagnetic fields from penetrating into the battery space 530d and into the interior of the vehicle, there may be a conductive shield 532d (for example, a copper sheet) between the battery space 530d and the vehicle. Furthermore, a non-conductive (for example, plastic) protective layer 533d may be used to protect the conductive shield 532d, the coil 536d, and the ferrite material 538d from environmental impacts (for example, mechanical damage, oxidization, etc.). Furthermore, the coil 536d may be movable in lateral X and/or Y directions. FIG. 5D illustrates an embodiment wherein the electric vehicle induction coil module 540d is deployed in a downward Z direction relative to a battery unit body.

The design of this deployable electric vehicle induction coil module 542b is similar to that of FIG. 5B except there is no conductive shielding at the electric vehicle induction coil module 542d. The conductive shield 532d stays with the battery unit body. The protective layer 533d (for example, plastic layer) is provided between the conductive shield 432d and the electric vehicle induction coil module 542d when the electric vehicle induction coil module 542d is not in a deployed state. The physical separation of the electric vehicle induction coil module 542 from the battery unit body may have a positive effect on the induction coil's performance.

As discussed above, the deployed electric vehicle induction coil module 542d may contain only the coil 536d (for example, Litz wire) and ferrite material 538d. Ferrite backing may be provided to enhance coupling and to prevent from excessive eddy current losses in a vehicle's underbody or in the conductive shield 532d. Moreover, the electric vehicle induction coil module 542d may include a flexible wire connection to power conversion electronics and sensor electronics. This wire bundle may be integrated into the mechanical gear for deploying the electric vehicle induction coil module 542d.

Figure 6:
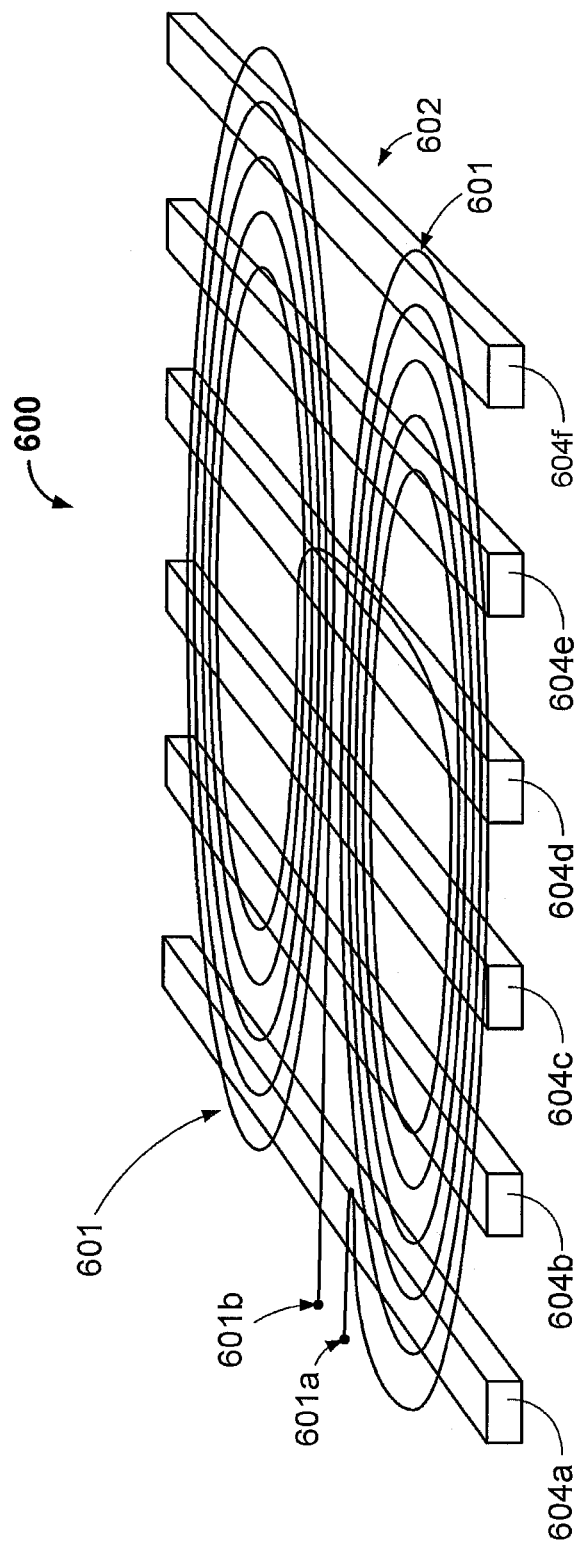
FIG. 6 is a schematic of a ferrite core for an induction coil in accordance with an exemplary embodiment of the disclosure.

FIG. 6 is a schematic diagram of a wireless power transfer device 600 according to an exemplary embodiment of the disclosure. Wireless power transfer device 600 includes, for example, an induction coil 601 positioned above a physical core 602 formed of electromagnetically permeability members. In the embodiment shown in FIG. 6, wireless power transfer device 600 includes two induction coils 601a and 601b, and physical core 602 includes six bars 604a-f arranged substantially parallel to one another with air gaps in between. When current is passed through the coils, lines of magnetic flux arc between the coils and pass through the parallel bars to create a "flux pipe" if high flux concentration above the coils.

In certain embodiments, the physical core is made of ferrite. Ferrite is commonly used for inductor coils because of its high electromagnetic permeability and low electrical conductivity. However, other materials may be used in other embodiments of the disclosure. In the following description, properties of ferrite cores and embodiments of the disclosure including, for example, ferrite cores will be discussed by way of example. It will be understood that these properties may also be characteristics of other materials suitable for use in a physical core of a wireless power transfer device and embodiments may also include such other materials. For example amorphous metal alloys or tempered silicon steel.

The physical core 602 is typically wider and longer than the area covered by induction coils 601. This ensures any electromagnetic fields on the ferrite side of the induction coils 601 are constrained to the ferrite cores.

In practice, bars of ferrite 604a-f as shown in FIG. 6 constructed from a single piece of ferrite are not practical due to limitations in, and the expense of the manufacture of ferrite materials. Due to these limitations and expense, ferrite is typically limited to a range of standard sized ferrite bars and standard E-shaped cores. If the desired size of a wireless power transfer device differs from the standard available sizes, cores consisting of a homogeneous lump of ferrite must be tailor made, which is expensive.

As shown in FIG. 6, in one embodiment, a plurality of short ferrite bars 603 are abutted end to end in order to construct each long bar 604a-f.

In one embodiment, the physical core includes a single ferrite bar which itself includes a plurality of smaller bars abutting end to end. Depending on the dimensions of the physical core required, ferrite bars of varying sizes (including available standard sizes) may be placed side by side in some embodiments, instead of end to end.

Because ferrite is much more magnetically permeable than air, electromagnetic fields will concentrate so as to pass through the low reluctance path of the ferrite rather than through air or any other nearby material having a higher reluctance. This characteristic means a single ferrite slab may be replaced by a series of parallel spaced bars of ferrite material, as shown in FIG. 6, without significant loss in power transfer. FIG. 6 shows a physical core or backing 602 including, for example, six parallel ferrite bars 604a-f. The spacing between the bars will typically be optimized so electromagnetic fields produced by adjacent induction coil 601 or any other nearby electromagnetic field will mostly pass within the ferrite bars 604*a-f*. It will be appreciated that as the bars 604*a-f* become more widely spaced the reluctance path for fields not directly aligned with the bars will increase. Typically the bars 604*a-f* will extend across the entire length or width of an induction coil. The number of bars and spacing therebetween may be selected to achieve a particular preferred value of inductance for a given induction coil. The reason for this is that the inductance of an induction coil adjacent to the bars will vary with changes in material, proximity and configuration of the ferrite backing.

One particular issue that may arise with ferrite structures constructed from a plurality of separate standard sized ferrites, such as ferrite bars 604*a-f* shown in FIG. 6, is that any changes in the electromagnetic permeability of the structure over the specified permeability of the standard sized ferrites may have a significant effect on the inductance of an adjacent induction coil. Variations in permeability may be caused by a variety of factors, including manufacturing tolerances, however one major contributor to variations in permeability is the coupling between adjacent ferrites. The presence of an air gap or contamination between abutting faces of the ferrite material may therefore greatly influence the tuning of the transmitting coil or receiving coil and subsequently result in inefficient energy transfer due to poor coupling between a transmitting and a receiving induction coil. The reason for this is that the ferrite acts like a pipe through which electromagnetic fields flow, a reduced permeability is equivalent to a restriction in the pipe and therefore a reduction in the magnitude of the electromagnetic field that can flow down the pipe.

In order to reduce air gaps between adjacent ferrite bars 603 when they are positioned end to end to form a bar 604, or positioned together to form a grid, a longitudinal pressure may be applied along the lines of short ferrite bars in some embodiments. This pressure ensures tight coupling between the ferrite bars and therefore results in a permeability which is substantially the same as if the ferrite was formed from a single piece of ferrite.

Figure 7:
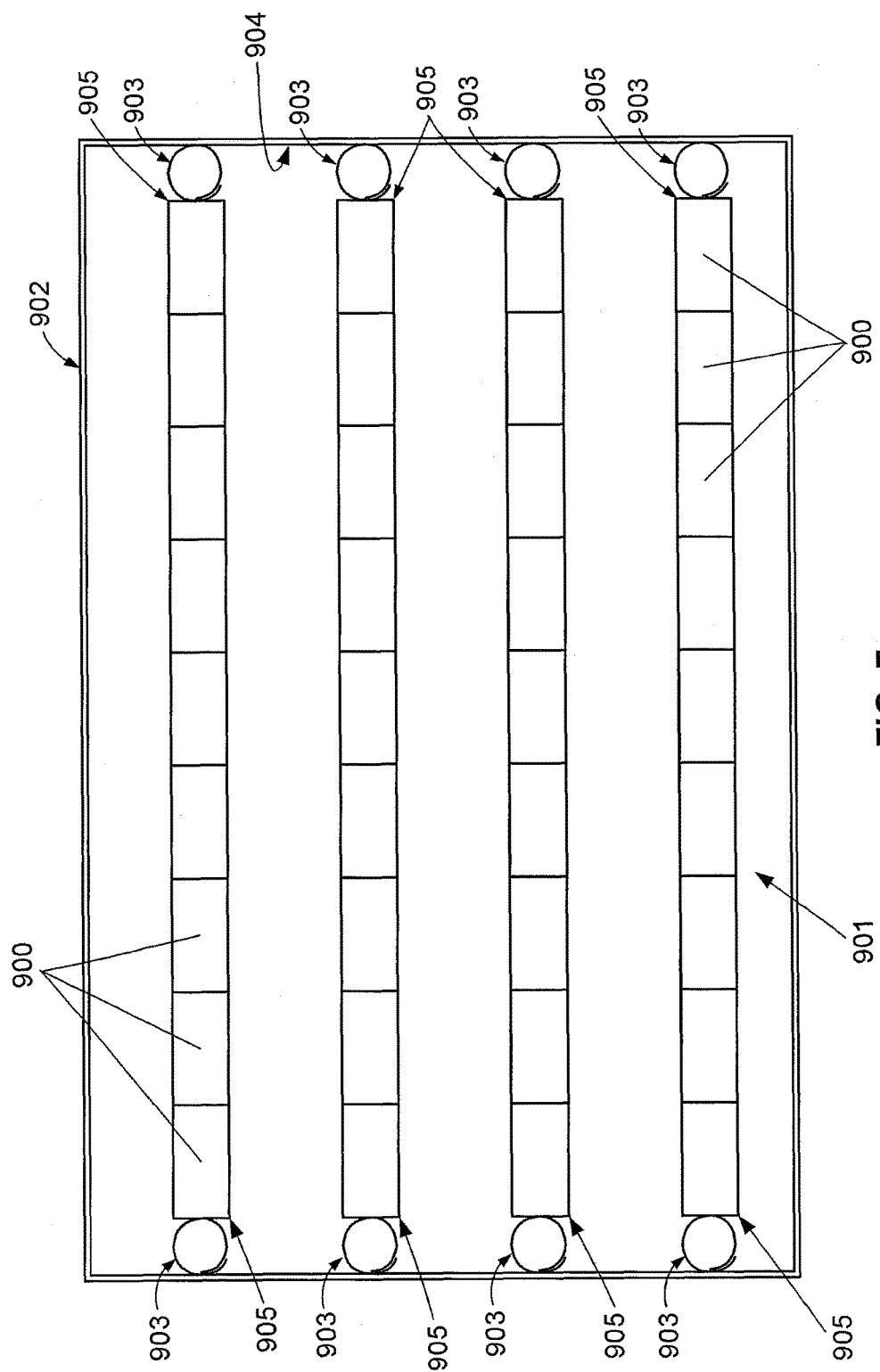
FIG. 7 is a schematic diagram of a ferrite core in accordance with an exemplary embodiment of the disclosure.

FIG. 7 shows a series of parallel lines of ferrite bars 900 forming a ferrite core or backing. The backing is housed within a wireless power transfer device casing 902. The ferrite bars 900 are initially positioned adjacent one another and then pressed together by way of a longitudinal force applied by resilient spring members 903. In the embodiments shown, resilient spring members 903 press against the walls 904 of casing 902 and the ends of the outermost ferrite bars 905. The squeezing pressure applied between the outermost ferrite bars 905 and the walls 904 of casing 902. by resilient spring members 903 minimizes the air gaps between the individual ferrite bars 900.

When longitudinal pressure is applied to a series of ferrite bars as has been described, the bars can jump out of place, particularly if they are not placed on a flat surface. This is analogous to laying a number of blocks in a line end for end and pressing inwards on the outermost ends of the line of blocks. As the pressure is increased any irregularities in the blocks will result in the line of blocks bowing and jumping out of position. Furthermore, the type of Ferrite which can be used in non-permanent magnetic structures may be referred to as a 'soft ferrite.' A 'soft ferrite' refers to the coercivity of the material rather than its physical attributes. Soft ferrites are, like most other ceramics, hard and brittle. Therefore, the ferrites are prone to shearing if an uneven or excessive force is applied.

To address this problem, some embodiments of the disclosure include, for example, a method in which, once the bars are in position and squeezing pressure is applied by spring members 903, the casing is at least partially filled with a retaining compound such as resin 901 and allowed to set. Once the retaining compound has set spring members 903 may be removed. Tight coupling is maintained between the ferrite bars 900 due to the retaining compound. The casing 902 may also house other components of an IPT system, including the induction coil (not shown). The retaining compound 901 therefore retains the relative spacing of and pressure between adjacent ferrite bars as well as the spacing and orientation of an associated induction coil.

In some embodiments upon applying pressure with a resilient spring members 903 to the ferrite bars 900 the ferrite bars 900 may be bonded together with glue or other adhesive to maintain the applied pressure once the resilient spring members 903 are removed.

In some embodiments a resilient spring member 903 may be positioned at one end of a line of ferrites, the other end of the line of ferrite bars 900 may press against an opposite side of the casing 902 to which the resilient spring member 903 pushes. Alternatively, although the walls of casing 902 provide a convenient fixed surface by which resilient spring members are able to impart an inward force on ferrite bars 900, in other embodiments the resilient spring members or one end of the line of ferrite bars 900 may press against any other fixed structure in the casing 902.

In the embodiment of FIG. 7, each resilient spring member 903 is shown as a spiral spring tube. When the tube is rotated in on itself its diameter is reduced and once released the tube unfurls, increasing its diameter and applying outward pressure around it periphery. By placing a wound tube at each end of a line of ferrites and allowing the tube to unfurl so as to abut both the end of the line of ferrites and a portion of a casing into which the ferrites are placed, a longitudinal force is applied along the length of the line of ferrites. The tube can be released by simply squeezing and pulling it free. It will however be appreciated that any number of resilient springs are readily available which could be used to apply pressure between the shell and the end of a line of ferrites.

In some embodiments of the disclosure, the resilient spring members are left in place in the wireless power transfer device. This may be considered an alternative or an addition to using resin to hold the ferrite bars in position. In such embodiments, the resilient spring members may be formed of a magnetically and electrically insulating material to avoid interfering with power transfer with another wireless power transfer device.

In certain embodiments the ferrites are held together by resin, epoxy or the like. In such embodiments the spring members 903 may be removed once the resin has set sufficiently to hold the ferrites in position relative to one another.

In such embodiments the force applied to the line of ferrite bars 900 by the spring member 903 may be configured to establish a degree of magnetic coupling between adjacent ferrites and/or to prevent the ingress of resin or the like between adjacent ferrites.

Figure 8:
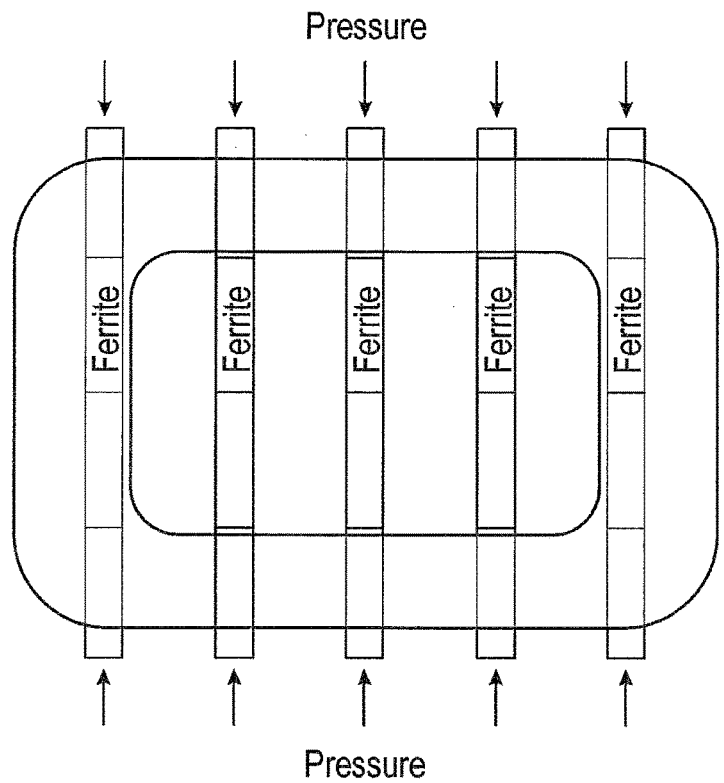
FIG. 8 is a schematic diagram of a ferrite core with ferrite material placed transversely in relation to an induction coil.
Figure 9:
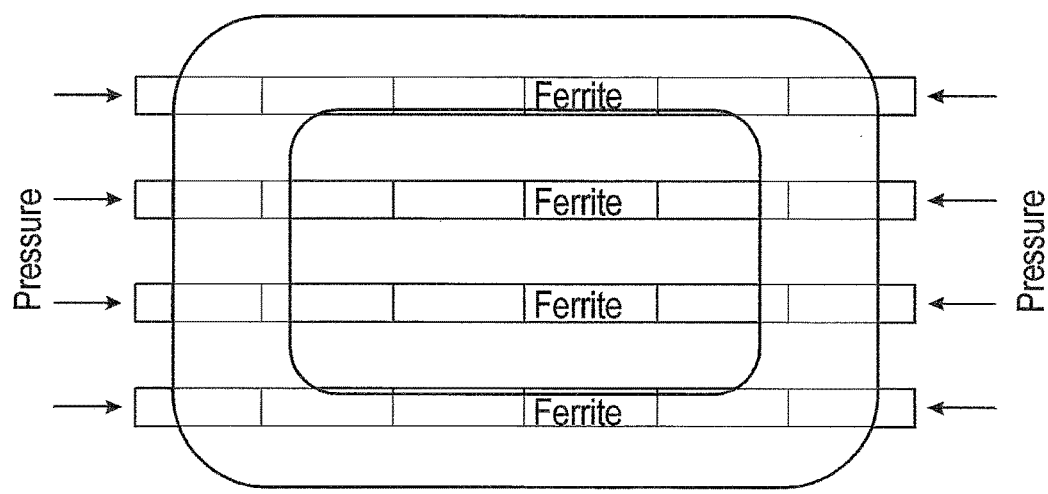
FIG. 9 is a schematic diagram of a ferrite core with ferrite material placed in a longitudinal direction with respect to an induction coil.
Figure 10:
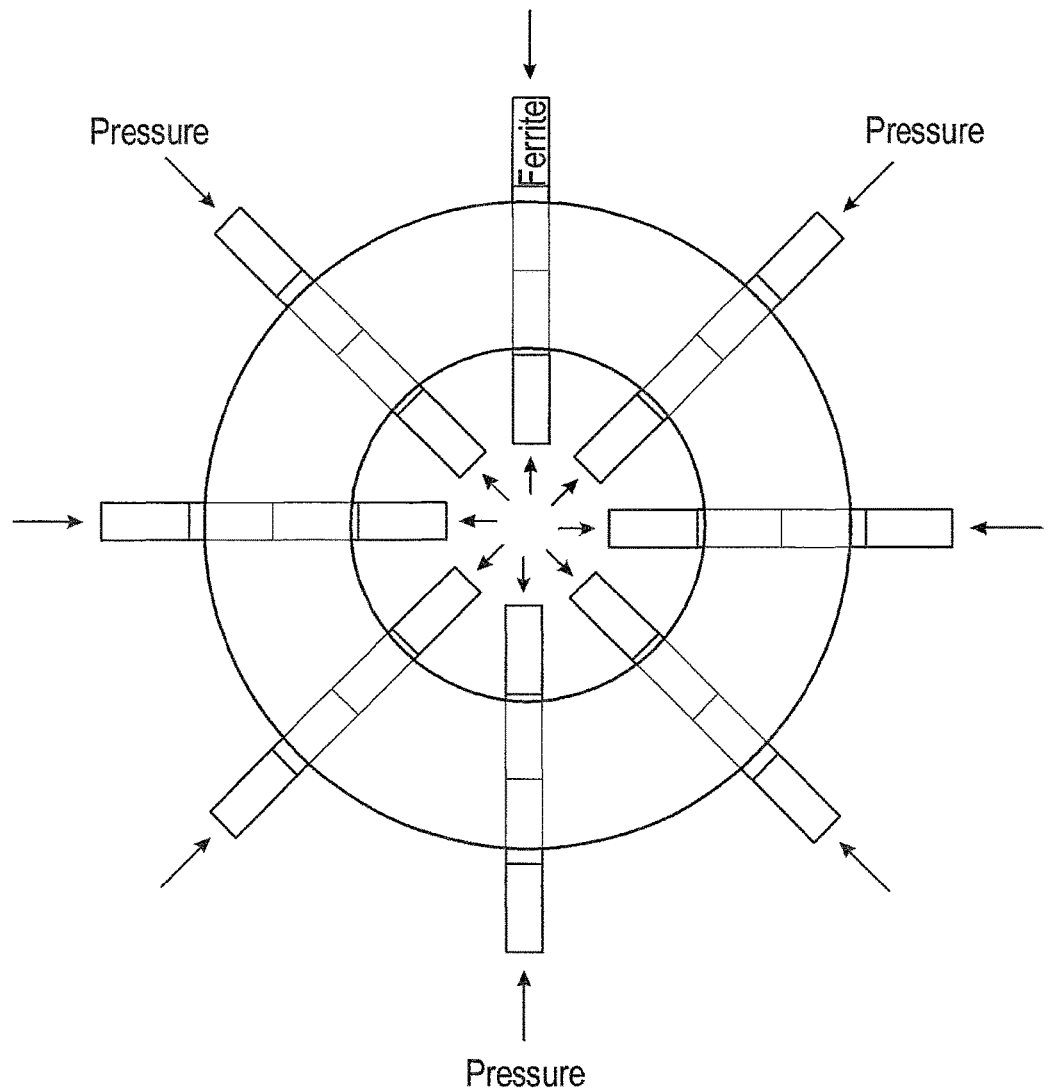
FIG. 10 is a schematic diagram of a ferrite core with ferrite material placed radially with respect to an induction coil.

FIG. 8 is a schematic diagram of a ferrite core with ferrite material placed in lines transversely in relation to an induction coil. FIG. 9 is a schematic diagram of a ferrite core with ferrite material placed in a longitudinal direction with respect to an induction coil. FIG. 10 is a schematic diagram of a ferrite core with ferrite material placed radially with respect to an induction coil. In each of FIGS. 8, 9 and 10, arrows indicate pressure (a force) applied to an end of a line of ferrite material. In some embodiments, the pressure is applied by a spring member similar to those illustrated in FIG. 7. In some embodiments the pressure is applied by a resin, epoxy or other similar adhesive-type material. In some embodiments the pressure is applied by a housing surrounding the ferrite core.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

Information and signals may be represented using any of a variety of different technologies and techniques. For example, data, instructions, commands, information, signals, bits, symbols, and chips that may be referenced throughout the above description may be represented by voltages, currents, electromagnetic waves, electromagnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the embodiments of the disclosure.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any processor, controller, microcontroller, or state machine. A processor may also be implemented as a combination of computing devices, for example, a combination of a DSP and a microprocessor or a plurality of microprocessors, in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as an instruction, instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the embodiments described herein.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features have been described herein. It is to be understood that not necessarily all such advantages may be achieved in accordance with any particular embodiment. Thus, the invention may be embodied or carried out in a manner that achieves or optimizes one advantage or group of advantages as taught herein without necessarily achieving other advantages as may be taught or suggested herein.

While this invention has been described in connection with what is are presently considered to be practical embodiments, it will be appreciated by those skilled in the art that various modifications and changes may be made without departing from the scope of the present disclosure. It will also be appreciated by those of skill in the art that parts mixed with one embodiment are interchangeable with other embodiments; one or more parts from a depicted embodiment can be included with other depicted embodiments in any combination. For example, any of the various components described herein and/or depicted in the Figures may be combined, interchanged or excluded from other embodiments. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. Thus, while the present disclosure has described certain exemplary embodiments, it is to be understood that the invention is not limited to the disclosed embodiments, but, on the contrary, is intended to cover various modifications and equivalent arrangements included within the scope of the appended claims, and equivalents thereof.

What is claimed is:

1. A method of forming a physical core of a wireless power transfer device, comprising:
    positioning two or more electromagnetically permeable members adjacent to one another;
    applying longitudinal pressure to a first end of one of the electromagnetically permeable members; and
    at least partially encapsulating the electromagnetically permeable members in retaining compound.

2. The method of claim 1, further comprising:
    allowing the retaining compound to at least partially set; and
    releasing the longitudinal pressure applied to the first end of the one electromagnetically permeable member.

3. The method of claim 1, wherein the step of positioning two or more electromagnetically permeable members includes positioning the two or more electromagnetically permeable members adjacent one another within a wireless power transfer device casing.

4. The method of claim 1, wherein the application of longitudinal pressure is applied by positioning a resilient spring member between the first end of the one electromagnetically permeable member and a first portion of the casing.

5. The method of claim 4, wherein the two or more electromagnetically permeable members are arranged in a line, wherein an additional resilient spring member is positioned between a second end of the two or more electromagnetically permeable members and a second portion of the casing.

6. A method of forming a wireless power transfer device, comprising the steps of:
    positioning two or more electromagnetically permeable members and an induction coil within a casing;
    arranging the electromagnetically permeable members to form a line of electromagnetically permeable members;
    positioning the electromagnetically permeable members in electromagnetic association with the induction coil;
    applying longitudinal pressure to a first end of the line of electromagnetically permeable members, and
    at least partially encapsulating the electromagnetically permeable members in a retaining compound.

7. The method of claim 6, further comprising:
    allowing the retaining compound to at least partially set, and
    releasing the longitudinal pressure applied to the end of each line of electromagnetically permeable members.

8. The method of claim 6, wherein the step of positioning two or more electromagnetically permeable members includes positioning the two or more electromagnetically permeable members adjacent one another within a wireless power transfer device casing.

9. The method of claim 6, wherein the application of longitudinal pressure is applied by positioning a resilient spring member between the first end of the line of electromagnetically permeable members and a first portion of the casing.

10. The method of claim 9, wherein an additional resilient spring member is positioned between a second end of the line of electromagnetically permeable members and a second portion of the casing.

11. A method of wirelessly transferring power with a wireless power transfer device, the method comprising:
    coupling the wireless power transfer device to a magnetic field via an induction coil;
    concentrating the magnetic field via a plurality of electromagnetically permeable members placed within the wireless power transfer device; and
    transferring power via the magnetic field,
    wherein two or more of the electromagnetically permeable members abut one another, wherein the plurality of electromagnetically permeable members are at least partially encapsulated in a retaining compound, and wherein the retaining compound maintains an applied longitudinal pressure between adjacent electromagnetically permeable members.

12. The method of claim 11, wherein the electromagnetically permeable members are arranged in a plurality of substantially parallel lines.

13. The method of claim 12, wherein the plurality of electromagnetically-permeable members are spaced in adjacent parallel lines configured to allow a substantial portion of the magnetic field produced by the induction coil to pass through the parallel lines of electromagnetically permeable members.

14. The method of claim 11, wherein the electromagnetically permeable members include ferrite bars.

15. The method of claim 11, The wireless power transfer device of claim 1, wherein the electromagnetically permeable members and induction coil are housed within a casing.

16. The method of claim 11, wherein pressure is applied to the two or more abutting electromagnetically permeable members to reduce air gaps between the two or more of the electromagnetically permeable members abutting one another when positioned end to end to form a bar or positioned in a grid.

17. The method of claim 16, wherein the applied pressure is maintained between the two or more of the electromagnetically permeable members abutting one another using an adhesive applied between abutting electromagnetically permeable members.

18. The method of claim 17, wherein the two or more of the electromagnetically permeable members abutting one another are tightly spaced such that their permeability is substantially similar to a permeability of a single electromagnetically permeable member.

19. The method of claim 11, wherein the retaining compound is further configured to maintain a position of the plurality of electromagnetically permeable members.

20. The method of claim 11, wherein the retaining compound is further configured to maintain a spacing of and an orientation of the induction coil.

21. An apparatus for wirelessly transferring power, comprising:
means for housing:
means for coupling the apparatus to a magnetic field;
a plurality of means for concentrating the magnetic field;
means for transferring power via the magnetic field; and
means for encapsulating the concentrating means,
wherein two or more of the concentrating means abut one another and wherein the encapsulating means maintains an applied longitudinal pressure between adjacent concentrating means, and wherein the housing means comprises the coupling means, the plurality of concentrating means, and the encapsulating means.

22. The apparatus of claim 21, wherein the concentrating members are arranged in a plurality of substantially parallel lines.

23. The apparatus of claim 22, wherein spacing between adjacent parallel lines is configured to allow a substantial portion of the magnetic field produced by the coupling means to pass through the parallel lines of concentrating means.

24. The apparatus of claim 21, wherein the concentrating means include ferrite bars.

25. The apparatus of claim 21, wherein the concentrating means and the coupling means are housed within the housing means.

26. The apparatus of claim 21, wherein an applied pressure reduces air gaps between the two or more concentrating means abutting one another when positioned end to end to form a bar or positioned in a grid.

27. The apparatus of claim 26, wherein the applied pressure is maintained between the two or more concentrating means abutting one another via an adhesive applied between the two or more concentrating means.

28. The apparatus of claim 27, wherein the two or more concentrating means abutting one another are tightly spaced such that their permeability is substantially similar to a permeability of a single concentrating means.

29. The apparatus of claim 21, wherein the encapsulating means is further configured to maintain a position of the plurality of concentrating means.

30. The apparatus of claim 21, wherein the encapsulating means is further configured to maintain a spacing of and an orientation of the coupling means.

* * * * *